(12) United States Patent
Lee

(10) Patent No.: US 12,295,135 B2
(45) Date of Patent: May 6, 2025

(54) MEMORY DEVICE, AND SEMICONDUCTOR STRUCTURE AND FORMING METHOD THEREOF

(71) Applicant: CHANGXIN MEMORY TECHNOLOGIES, INC., Hefei (CN)

(72) Inventor: Shih-Hung Lee, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 351 days.

(21) Appl. No.: 17/656,769

(22) Filed: Mar. 28, 2022

(65) Prior Publication Data

US 2022/0231028 A1      Jul. 21, 2022

Related U.S. Application Data

(63) Continuation of application No. PCT/CN2021/112022, filed on Aug. 11, 2021.

(30) Foreign Application Priority Data

Jan. 19, 2021    (CN) .......................... 202110067276.1

(51) Int. Cl.
*H10B 12/00* (2023.01)
*G11C 11/16* (2006.01)
(Continued)

(52) U.S. Cl.
CPC .......... *H10B 12/053* (2023.02); *G11C 11/161* (2013.01); *H10B 12/34* (2023.02);
(Continued)

(58) Field of Classification Search
CPC ...... H10B 12/053; H10B 12/34; H10B 12/00; H10B 12/315; H10B 12/488; H01L 21/28;
(Continued)

(56) References Cited

U.S. PATENT DOCUMENTS 5,241,193 A    8/1993    Pfiester et al.
8,211,775 B1   7/2012    Ma et al.
(Continued)

FOREIGN PATENT DOCUMENTS

CN    101789368 A    7/2010
CN    105990137 A    10/2016
(Continued)

OTHER PUBLICATIONS

International Search Report cited in PCT/CN2021/112022 mailed Nov. 19, 2021, 9 pages.
(Continued)

*Primary Examiner* — Kretelia Graham
*Assistant Examiner* — Jaesun Lee
(74) *Attorney, Agent, or Firm* — Kilpatrick Townsend & Stockton LLP

(57) ABSTRACT

The present disclosure relates to the technical field of semiconductors, and provides a memory device, and a semiconductor structure and a forming method thereof. The forming method includes: providing a substrate, where the substrate includes a source region and a drain region spaced apart from each other, and a gate trench located between the source region and the drain region; forming, in sequence on an inner wall of the gate trench, a gate oxide layer, an interface layer, and a conductive layer that fills the gate trench; and etching back the side of the interface layer away from the bottom of the gate trench by using a wet etching process, such that a top height of the interface layer is lower than a top height of the conductive layer.

9 Claims, 8 Drawing Sheets

(51) Int. Cl.
　　*H10B 61/00*　　　(2023.01)
　　*H10N 50/01*　　　(2023.01)
　　*H10N 50/85*　　　(2023.01)

(52) U.S. Cl.
　　CPC ............. *H10B 61/22* (2023.02); *H10N 50/01* (2023.02); *H10N 50/85* (2023.02)

(58) Field of Classification Search
　　CPC . H01L 29/423; H01L 29/66477; H01L 29/78; H01L 21/28008; H01L 29/4236
　　See application file for complete search history.

(56) References Cited

U.S. PATENT DOCUMENTS

| | | | |
|---|---|---|---|
| 8,420,484 B2 | 4/2013 | Yoo | |
| 8,470,702 B2 | 6/2013 | Yang | |
| 9,224,619 B2 | 12/2015 | Yi et al. | |
| 10,050,038 B2 | 8/2018 | Lee et al. | |
| 10,790,287 B2 | 9/2020 | Kang et al. | |
| 2004/0235253 A1* | 11/2004 | Kim ................... | H01L 29/66621 257/E21.429 |
| 2006/0097314 A1* | 5/2006 | Uchiyama ......... | H01L 29/66621 257/E29.267 |
| 2007/0200178 A1 | 8/2007 | Yun et al. | |
| 2008/0138952 A1 | 6/2008 | Cho et al. | |
| 2008/0268588 A1* | 10/2008 | Anderson ............. | H01L 29/665 257/E27.114 |
| 2010/0065926 A1* | 3/2010 | Yeh .................... | H01L 29/42376 257/E21.409 |
| 2015/0221742 A1* | 8/2015 | Yi ..................... | H01L 21/32133 257/295 |
| 2016/0172488 A1* | 6/2016 | Oh ....................... | H10B 12/315 257/330 |
| 2017/0365608 A1* | 12/2017 | Lee ..................... | H01L 29/4236 |
| 2018/0097084 A1* | 4/2018 | Wang ................ | H01L 29/66545 |
| 2019/0229198 A1* | 7/2019 | Huang ................ | H01L 29/7806 |
| 2019/0259839 A1* | 8/2019 | Ryu .................. | H01L 29/66734 |

FOREIGN PATENT DOCUMENTS

| | | |
|---|---|---|
| CN | 107527912 A | 12/2017 |
| CN | 108110005 A | 6/2018 |

OTHER PUBLICATIONS

State Intellectual Property Office of the People's Republic of China, First Office Action and Search Report Issued in Application No. 202110067276.1, Jun. 13, 2024, 11 pages.

* cited by examiner

MEMORY DEVICE, AND SEMICONDUCTOR STRUCTURE AND FORMING METHOD THEREOF

CROSS-REFERENCE TO RELATED APPLICATIONS

This is a continuation of International Patent Application No. PCT/CN2021/112022, filed on Aug. 11, 2021, which claims the priority to Chinese Patent Application No. 202110067276.1, titled "MEMORY DEVICE, AND SEMICONDUCTOR STRUCTURE AND FORMING METHOD THEREOF" and filed on Jan. 19, 2021. The entire contents of International Patent Application No. PCT/CN2021/112022 and Chinese Patent Application No. 202110067276.1 are incorporated herein by reference.

TECHNICAL FIELD

The present disclosure relates to the technical field of semiconductors, and specifically, to a memory device, and a semiconductor structure and a forming method thereof.

BACKGROUND

Dynamic random access memories (DRAM) are widely applied to mobile devices such as mobile phones and tablet computers due to advantages of small size, high integration, and high transmission speed. As a core component of a DRAM, a word line structure is mainly used to control on or off of a transistor.

During manufacturing of a word line structure, each film layer is usually etched by using a dry etching process. However, dry etching usually causes residues in a trench wall used for forming the word line structure, leading to structural defects, and further increasing a gate-induced drain leakage current.

It should be noted that information disclosed in the above background section is used merely for a better understanding of the background of the present disclosure, and therefore may include information that does not constitute the prior art known to persons of ordinary skill in the art.

SUMMARY

The present disclosure provides a memory device, and a semiconductor structure and a forming method thereof.

According to one aspect of the present disclosure, a method of forming a semiconductor structure is provided, including:

providing a substrate, where the substrate includes a source region and a drain region spaced apart from each other, and a gate trench located between the source region and the drain region;

forming, in sequence on an inner wall of the gate trench, a gate oxide layer, an interface layer, and a conductive layer that fills the gate trench; a thickness of a side of the interface layer away from the bottom of the gate trench being greater than a thickness of a side of the interface layer close to the bottom of the gate trench; and etching back the side of the interface layer away from the bottom of the gate trench by using a wet etching process, such that a top height of the interface layer is lower than a top height of the conductive layer.

According to one aspect of the present disclosure, a semiconductor structure is provided, including:

a substrate, wherein the substrate includes a source region and a drain region spaced apart from each other, and a gate trench located between the source region and the drain region; and a gate oxide layer, an interface layer and a conductive layer that fills the gate trench; wherein the gate oxide layer, the interface layer and the conductive layer are formed in sequence on an inner wall of the gate trench; a thickness of a side of the interface layer away from a bottom of the gate trench is greater than a thickness of a side of the interface layer close to the bottom of the gate trench; and a top height of the interface layer is lower than a top height of the conductive layer.

According to one aspect of the present disclosure, a memory device is provided, including the semiconductor structure according to any one of the foregoing aspects.

It should be understood that the above general description and the following detailed description are only exemplary and explanatory, and should not be construed as a limitation to the present disclosure.

BRIEF DESCRIPTION OF THE DRAWINGS

The accompanying drawings, which are incorporated into and constitute a part of the description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
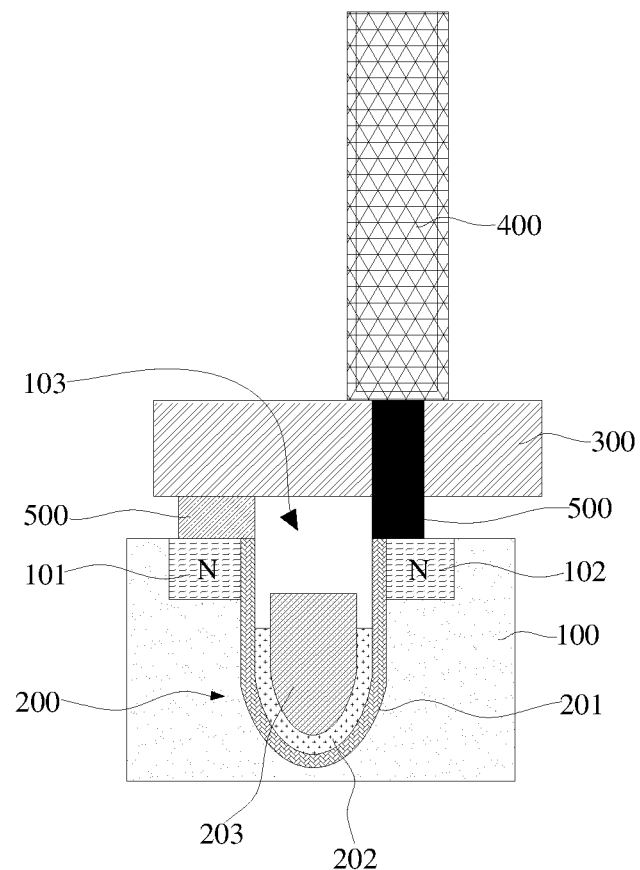
FIG. 1 is a schematic diagram of a semiconductor structure in the related art.

Exemplary embodiments will be described below in further detail with reference to the accompanying drawings. However, the exemplary implementations can be implemented in various forms, and should not be construed as being limited to those described herein. On the contrary, these exemplary implementations are provided to make the present invention comprehensive and complete and to fully convey the concept manifested therein to those skilled in the art. The same reference numerals in the figures indicate the same or similar structures, and thus their detailed descriptions will be omitted.

The foregoing described features, structures, or characteristics may be incorporated into one or more implementations in any suitable manner. If possible, the features discussed in the various embodiments are interchangeable. In the foregoing description, many specific details are provided to give a full understanding of the embodiments of the present invention. However, those skilled in the art will be aware that the technical solutions of the present invention may be practiced without one or more of the specific details, or other methods, materials, and the like may be used. In other cases, well-known structures, materials, or operations are not shown or described in detail to avoid obscuring aspects of the present invention.

Although relative terms such as "upper" and "lower" are used in this specification to describe the relative relationship of one component of an icon to another, these terms are used in this specification only for convenience, for example, according to the orientation of the examples described in the accompanying drawings. It can be understood that if the device of the icon is turned upside down, the components described as "upper" will become the "lower" components. When a structure is "on" other structures, it may mean that the structure is integrally formed on other structures, or that the structure is "directly" disposed on other structures, or that the structure is "indirectly" disposed on other structures through another structure.

The terms "one", "a", "the", "said", and "at least one" are used to indicate the presence of one or more elements/components/and the like; the terms "includes" and "has" are used to indicate an open-ended inclusion and to mean that additional elements/components/and the like may exist in addition to the listed elements/components/and the like. The terms "first" and "second" are used only as markers, not as a restriction on the number of objects.

Figure 2:
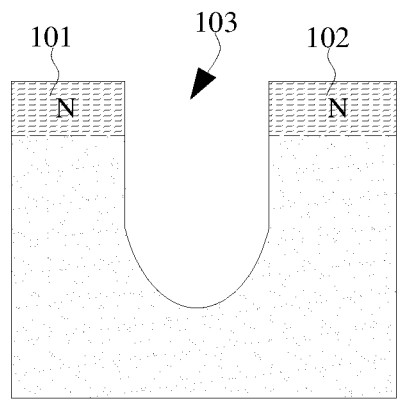
FIG. 2 is a schematic diagram of a gate trench in the related art.
Figure 3:
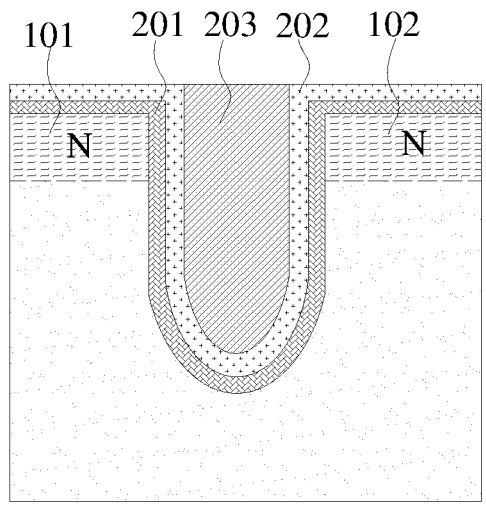
FIG. 3 is a schematic diagram of filling a gate oxide layer, an interface layer, and a conductive layer in the trench in the related art.
Figure 4:
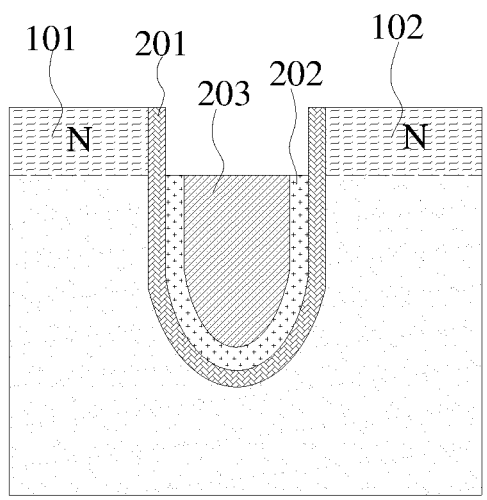
FIG. 4 is a schematic diagram of a structure obtained after dry etching in the related art.

In the related art, as shown in FIG. 1, a memory device mainly includes a substrate 100, a word line structure 200, a bit line structure 300, a storage capacitor 400, and a transistor. The bit line structure 300 is connected to a drain 101 of the substrate 100 through a contact structure 500. The word line structure 200 serves as a gate of the transistor, to control on or off of the transistor. The storage capacitor 400 communicates with a source 102 of the transistor through the contact structure 500. The word line structure 200 mainly includes a gate oxide layer 201, an interface layer 202, and a conductive layer 203 that fills a gate trench 103 that are formed on an inner wall of the gate trench 103. During manufacturing of the word line structure 200, as shown in FIG. 2 to FIG. 4, the substrate 100 is first slotted to form the gate trench 103; then the gate trench 103 is filled with the gate oxide layer 201, the interface layer 202, and the conductive layer 203; and then the interface layer 202 located on the inner wall of the gate trench 103 is etched back by using a dry etching process. However, due to the limitation of the dry etching process, residues usually appear in the groove wall, causing structural defects and increasing a leakage current. In addition, an etching depth of dry etching is relatively difficult to control, making etch uniformity of adjacent semiconductor structures reduced, which in turn may lead to an increased gate-induced drain leakage current in some transistors.

Figure 5:
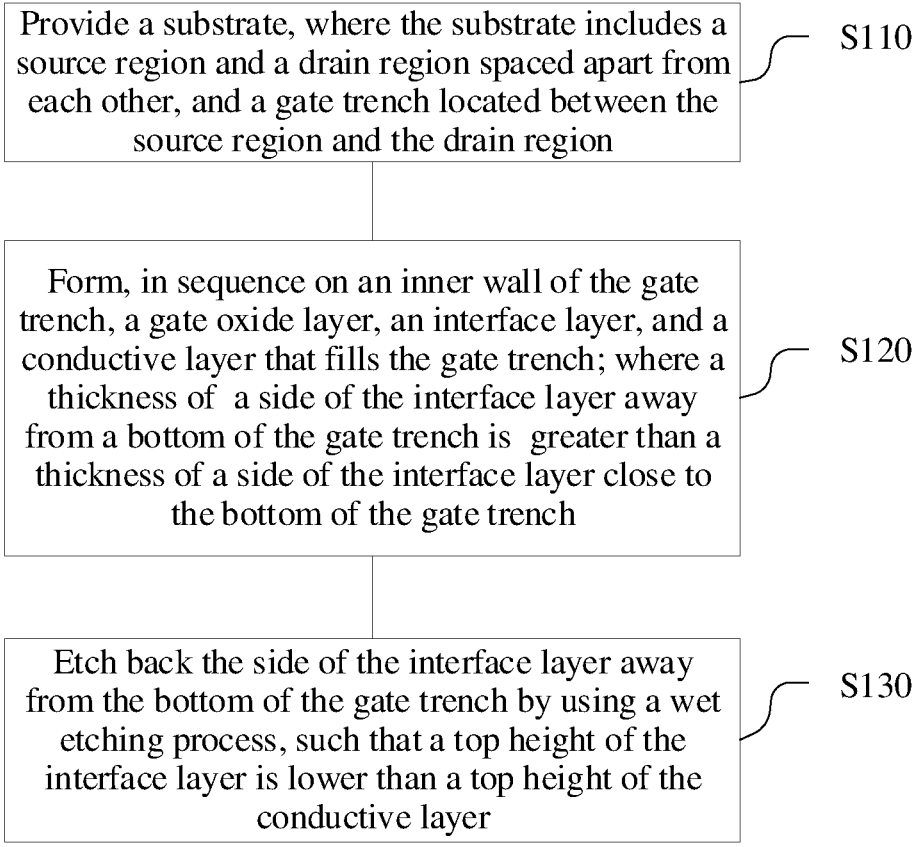
FIG. 5 is a flowchart of a method of forming a semiconductor structure according to an implementation of the present disclosure.

An implementation of the present disclosure provides a method of forming a semiconductor structure. As shown in FIG. 5, the method of forming a semiconductor structure may include:

Step S110. Provide a substrate, where the substrate includes a source region and a drain region spaced apart from each other, and a gate trench located between the source region and the drain region.

Step S120. Form, in sequence on an inner wall of the gate trench, a gate oxide layer, an interface layer, and a conductive layer that fills the gate trench, a thickness of a side of the interface layer away from the bottom of the gate trench is greater than a thickness of a side of the interface layer close to the bottom of the gate trench.

Step S130. Etch back the side of the interface layer away from the bottom of the gate trench by using a wet etching process, such that the top height of the interface layer is lower than the top height of the conductive layer.

In the method of forming a semiconductor structure in the present disclosure, an interface layer may be etched back by using a wet etching process, and an interface layer to be removed from a groove wall of a gate trench can be completely removed by isotropic etching, to avoid residuals and introduction of structural defects, thereby reducing a gate-induced drain leakage current. In addition, due to a greater thickness of the interface layer on a side away from the bottom of the gate trench, a wet etching area is relatively large during the etching back process, which facilitates execution of the wet etching process. In addition, a relatively large opening is formed after the etching back, such that the opening is subsequently filled with a dielectric with a relatively great thickness, thereby increasing a physical distance between a gate-drain overlapping region and a drain region, and further reducing the gate-induced drain leakage current. Further, the interface layer has a smaller thickness on a side close to the bottom of the gate trench, such that a resistance of the semiconductor structure can be reduced, and a capability of a gate to control the semiconductor structure can be improved.

The steps of the method of forming a semiconductor structure in this implementation of the present disclosure are described in detail below:

As shown in FIG. 5, in step S110, the substrate is provided, and the substrate includes the source region and the drain region spaced apart from each other, and the gate trench located between the source region and the drain region.

Figure 6:
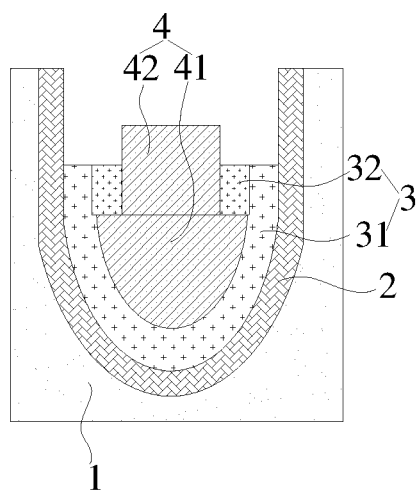
FIG. 6 is a schematic diagram of a semiconductor structure according to an implementation of the present disclosure.

As shown in FIG. 6, a material of a substrate 1 may be silicon or other semiconductor materials, and a shape and the material of the substrate 1 are not specially limited herein. A shallow trench isolation structure, a well region, or the like may also be formed on the substrate 1. The substrate 1 may be P-type, and may include a source region and a drain region spaced apart from each other. The source region and the drain region may be doped to form a source and a drain. For example, the source region and the drain region may be n-type doped. For example, the source region and the drain region may be doped with an n-type doping material, such that an n-type semiconductor is formed in the source region and the drain region. The n-type doping material may be an element in the IV main group of the periodic table. For example, the n-type doping material may be phosphorus, or certainly, may be a material of other elements, which are not be listed herein.

In an embodiment, phosphorus ions may be injected into the source region and the drain region by ion implantation. Certainly, other processes may be used to dope the source region and/or the drain region. This is not specially limited herein.

Figure 7:
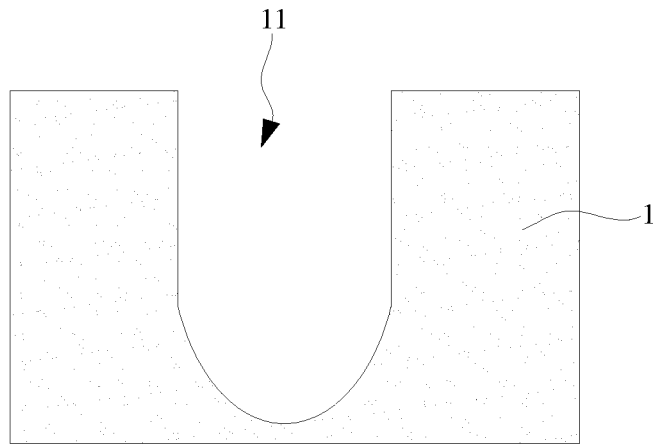
FIG. 7 is a schematic diagram of a gate trench according to an implementation of the present disclosure.

It should be noted that, a trench region may be located between the source region and the drain region, and there may be a gate trench 11 in the trench region. As shown in FIG. 7, a buried word line structure may be formed in the gate trench 11, and the word line structure serves as a gate of a transistor and can control on or off of the transistor.

For example, the trench region in the substrate 1 may be patterned to form the gate trench 11. For example, a photoresist may be formed on a surface of the substrate 1, and a mask plate may be used to expose the photoresist to form a developing region. A pattern of the developing region may be the same as a pattern required by the gate trench 11. Non-isotropic etching may be performed on the developing region by using a dry etching process, to form the gate trench 11.

In an implementation, a side wall of the gate trench 11 may extend along a direction perpendicular to the substrate 1. The bottom of the gate trench 11 may be in a shape of an arc, and an arc center thereof may be located in the gate trench 11. The side wall of the gate trench 11 may be connected to two ends of the arc. The gate trench 11 may have a depth of 100 nm to 300 nm. For example, the depth may be 100 nm, 150 nm, 200 nm, 250 nm, or 300 nm. The gate trench 11 may have a width of 10 nm to 50 nm. For example, the width may be 10 nm, 20 nm, 30 nm, 40 nm, or 50 nm. Certainly, the gate trench 11 may be of other sizes, which is not specially limited herein. It should be noted that, the width of the gate trench 11 may be a lateral dimension between side walls of the gate trench 11.

As shown in FIG. 5, in step S120, the gate oxide layer, the interface layer, and the conductive layer that fills the gate trench are formed in sequence on the inner wall of the gate trench, the thickness of the side of the interface layer away from the bottom of the gate trench is greater than the thickness of the side of the interface layer close to the bottom of the gate trench.

A fittedly attached gate oxide layer 2 and a fittedly attached interface layer 3 may be formed on the side wall and a bottom surface of the gate trench 11. The gate oxide layer 2 may be located between the interface layer 3 and the inner wall of the gate trench 11. In addition, a conductive layer 4 may be formed on a side of the interface layer 3 away from the gate oxide layer 2, and the conductive layer 4 can fill the gate trench 11. Arranging the interface layer 3 between the gate oxide layer 2 and the conductive layer 4 can adjust a work function of the device.

The thickness of the side of the interface layer 3 away from the bottom of the gate trench 11 may be greater than the thickness of the side of the interface layer 3 close to the bottom of the gate trench 11, and the conductive layer 4 and the interface layer 3 located at different depths of the gate trench 11 are in close contact with each other. The relatively small thickness of the interface layer 3 around the conductive layer 4 located on the side close to the bottom of the gate trench 11 can help reduce the resistance. In addition, due to a greater thickness of the interface layer 3 around the conductive layer 4 located on the side away from the bottom of the gate trench 11, a wet etching area is relatively large during a subsequent etching back process, which facilitates execution of the wet etching process. In addition, a relatively large opening is formed after the etching back, such that the opening is subsequently filled with a dielectric with a relatively great thickness, thereby increasing a physical distance between a gate-drain overlapping region and a drain region, and further reducing a gate-induced drain leakage current.

Figure 8:
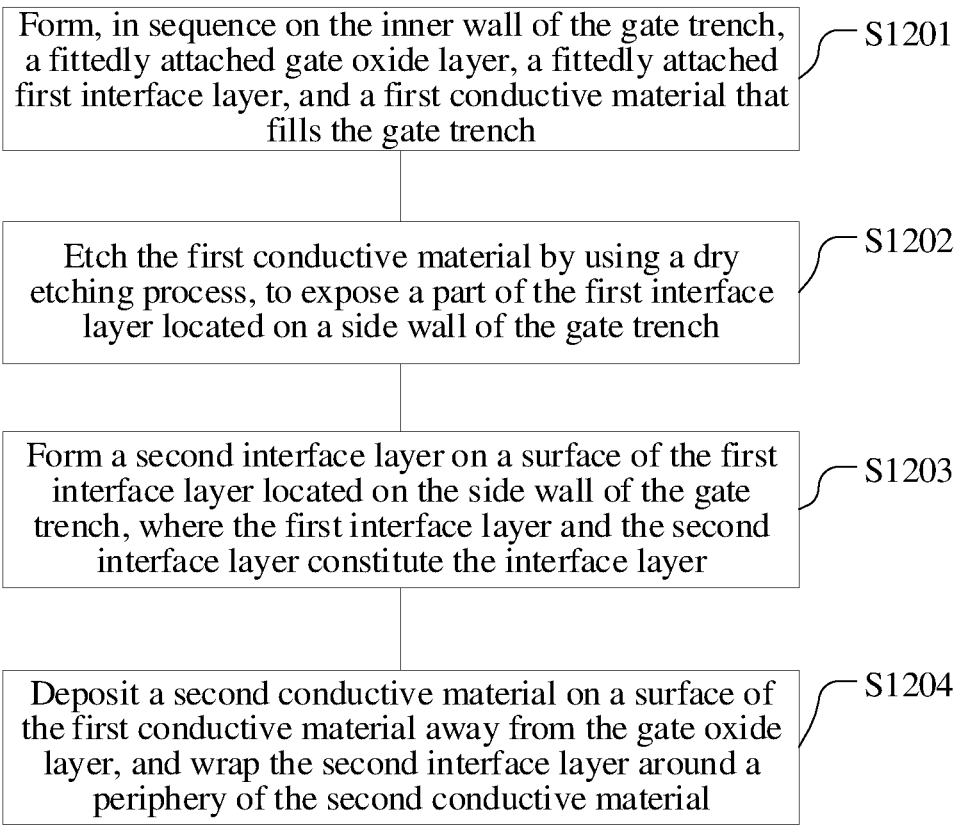
FIG. 8 is a flowchart of step S120 according to an implementation of the present disclosure.

In an implementation of the present disclosure, step S120 may include step S1201 to step S1204, as shown in FIG. 8:

Step S1201. Form, in sequence on the inner wall of the gate trench, a fittedly attached gate oxide layer, a fittedly attached first interface layer, and a first conductive material that fills the gate trench.

Figure 9:
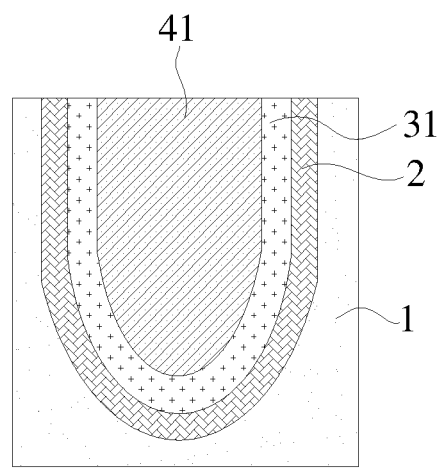
FIG. 9 is a schematic diagram of a structure obtained after step S1201 is completed according to an implementation of the present disclosure.

As shown in FIG. 9, the gate oxide layer 2, a first interface layer 31, and a first conductive material 41 may be formed in the gate trench 11 in a manner such as chemical vapor deposition, physical vapor deposition, thermal oxidation, vacuum evaporation, magnetron sputtering, or atomic layer deposition. The gate oxide layer 2 and the first interface layer 31 may be fittedly attached to the inner wall of the gate trench 11 in sequence. The first conductive material 41 may be formed on a side of the first interface layer 31 away from the gate oxide layer 2 and can fill the gate oxide layer 2.

For example, the fittedly attached gate oxide layer 2 may be formed on the inner wall of the gate trench 11 in a manner such as chemical vapor deposition, thermal oxidation, or atomic layer deposition. In addition, for process convenience, the gate oxide layer 2 can completely cover a top surface of the gate trench 11 during the formation process, and the gate oxide layer 2 located on the top surface of the gate trench 11 can be removed subsequently. Certainly, the gate oxide layer 2 may be formed in other manners. This is not specially limited herein.

A material of the gate oxide layer 2 may include silicon oxide, silicon nitride, silicon oxynitride, or other high-k dielectric materials, or may be a combination of the foregoing materials. The thickness of the gate oxide layer 2 may be 1 nm to 6 nm. For example, the thickness may be 1 nm, 2 nm, 3 nm, 4 nm, 5 nm, or 6 nm. Certainly, the thicknesses of the gate oxide layer 2 may be other values, which are not listed herein.

The first interface layer 31 may be fittedly attached to a surface of the gate oxide layer 2, a material of the first interface layer 31 may be titanium nitride, and a thickness of the first interface layer 31 may be 0.5 nm to 2 nm, for example, may be 0.5 nm, 1 nm, 1.5 nm, or 2 nm. In some embodiments, the first interface layer 31 may be formed on the gate oxide layer 2 by using a process such as chemical vapor deposition, physical vapor deposition, or atomic layer deposition. A forming process of the first interface layer 31 is not specially limited herein.

The first conductive material 41 may be deposited on the surface of the first interface layer 31. The first conductive material 41 can fill the gate trench 11. The first conductive material 41 may be metal tungsten. The first conductive material 41 may be formed on the surface of the first interface layer 31 by using a process such as vacuum evaporation, magnetron sputtering, or atomic layer deposition.

Step S1202. Etch the first conductive material by using a dry etching process, to expose a part of the first interface layer located on a side wall of the gate trench.

Figure 10:
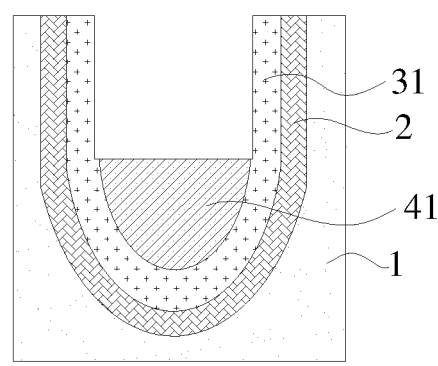
FIG. 10 is a schematic diagram of a structure obtained after step S1202 is completed according to an implementation of the present disclosure.

As shown in FIG. 10, non-isotropic etching may be performed on the first conductive material 41 by using the dry etching process, to remove part of the first conductive material 41, to expose a part of the first interface layer 31 located on the side wall of the gate trench 11. An etching depth of the first conductive material 41 may be 5 nm to 70 nm. For example, the etching depth may be 5 nm, 10 nm, 30 nm, 50 nm, or 70 nm, or certainly, may be other values, which are not listed herein.

During the etching of the first conductive material 41, an optical critical dimension (OCD) may be used to monitor the etching depth of the first conductive material 41, to accurately control the etching depth during the etching process. For example, during the etching process, the first conductive material 41 may be preliminarily etched. After the preliminary etching is completed, the OCD may be used to measure the etching depth, and determine whether the etching depth meets a process requirement. When the etching depth does not meet an etching depth requirement, the first conductive material 41 may be further etched, the etching depth thereof may be measured, and the etching stops until a detected depth meets the depth requirement.

Step S1203. Form a second interface layer on a surface of the first interface layer located on the side wall of the gate trench, where the first interface layer and the second interface layer constitute the interface layer.

Figure 11:
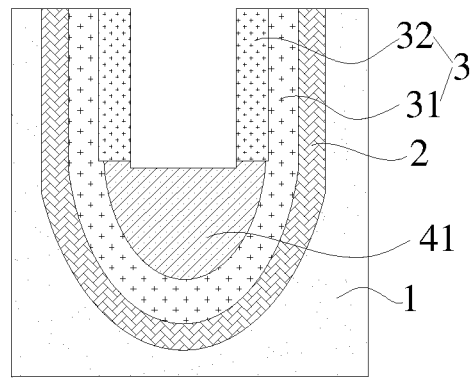
FIG. 11 is a schematic diagram of a structure obtained after step S1203 is completed according to an implementation of the present disclosure.

As shown in FIG. 11, after the first conductive material 41 is etched, a second interface layer 32 may be formed on a surface of the first interface layer 31 exposed on the side wall of the gate trench 11. A side of the second interface layer 32 close to the bottom of the gate trench 11 may be in contact with a surface of the remaining first conductive material 41, and the first interface layer 31 and the second interface layer 32 may constitute the interface layer 3, such that the thickness of the interface layer 3 formed on a side close to the bottom of the gate trench 11 is smaller than the thickness of the interface layer 3 formed on a side away from the bottom of the gate trench 11. Because the thickness of the interface layer 3 on the side close to the bottom of the gate trench 11 is smaller, a resistance can be reduced and power consumption can be reduced.

Figure 12:
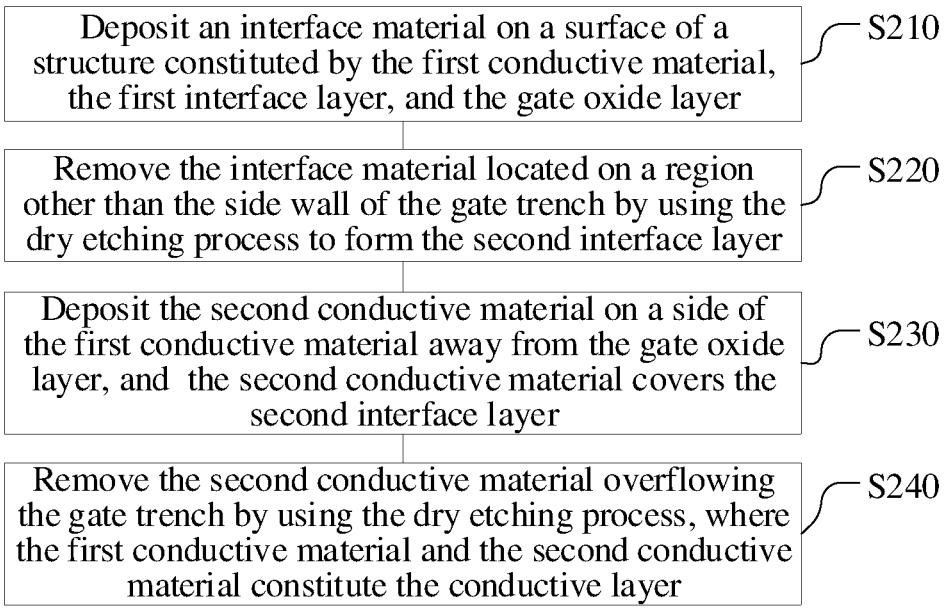
FIG. 12 is a flowchart of step S1203 and step S1204 according to an implementation of the present disclosure.

In an implementation of the present disclosure, the forming a second interface layer 32 on a surface of the first interface layer 31 located on the side wall of the gate trench 11, that is, step S1203, may include step S210 and step S220, as shown in FIG. 12:

Step S210. Deposit an interface material on a surface of a structure constituted by the first conductive material, the first interface layer, and the gate oxide layer.

Figure 13:
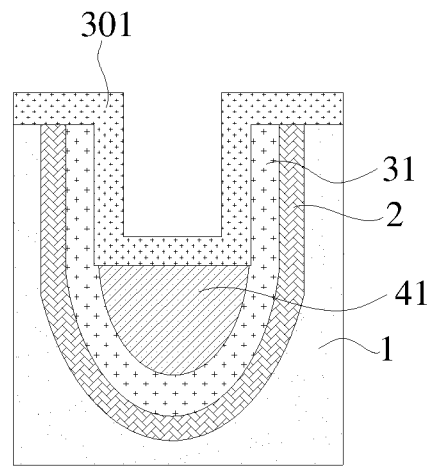
FIG. 13 is a schematic diagram of a structure obtained after step S210 is completed according to an implementation of the present disclosure.

As shown in FIG. 13, an interface material 301 may be formed on a surface of a structure constituted by the first conductive material 41, the first interface layer 31, and the gate oxide layer 2. For process convenience, the interface material 301 may cover the source region and the drain region. The material of the interface material 301 may be the same as the material of the first interface layer 31. For example, the material may be titanium nitride. The interface material 301 may be deposited by using a process such as chemical vapor deposition, physical vapor deposition, or atomic layer deposition. Certainly, the interface material 301 may alternatively be formed in other manners, which are not listed herein.

Step S220. Remove the interface material located on a region other than the side wall of the gate trench by using the dry etching process to form the second interface layer.

An interface material 301 located on a region other than the side wall of the gate trench 11 may be removed by using a process such as chemical polishing and dry etching to form the second interface layer 32. That is, the interface material 301 located on the top surface of the gate trench 11 and the surface of the first conductive material 41 is removed, only the interface material 301 located on the side wall of the gate trench 11 remains, and the remaining interface material 301 may be in contact with the surface of the first conductive material 41.

A thickness of the second interface layer 32 may be 2 nm to 10 nm. For example, the thickness may be 2 nm, 4 nm, 6 nm, 8 nm, or 10 nm, or certainly, may be other values, which are not listed herein. It should be noted that, a thickness of an overlapping part of the first interface layer 31 and the second interface layer 32 may be greater than 4 nm, such that an electric field between the drain region and the conductive layer 4 can be reduced, and a drain leakage current can be reduced, thereby improving structural reliability.

Step S1204. Deposit a second conductive material on a surface of the first conductive material away from the gate oxide layer, and wrap the second interface layer around a periphery of the second conductive material.

After the second interface layer 32 is formed, the second conductive material 42 may be deposited on a side of the first conductive material 41 away from the gate oxide layer 2, the second conductive material 42 may fill the gate trench 11 and may be in contact with the second interface layer 32. In this case, the second interface layer 32 may be wrapped around a periphery of the second conductive material 42. In addition, because the first interface layer 31 is located on a side of the second interface layer 32 away from the second conductive material 42, the first interface layer 31 and the second interface layer 32 constitute the interface layer, such that a thickness of the interface layer 3 located on the periphery of the second conductive material 42 is increased, thereby increasing a physical size between the second conductive material 42 and the source drain, reducing an electric field between the drain region and the second conductive material 42, reducing a drain leakage current, and improving structural reliability.

The material of the second conductive material 42 may be the same as the material of the first conductive material 41. For example, the material may be metal tungsten, or certainly, may be other conductive materials. This is not specially limited herein.

In an implementation of the present disclosure, the depositing a second conductive material 42 on a surface of the first conductive material 41 away from the gate oxide layer 2, and wrapping the second interface layer 32 around a periphery of the second conductive material 42 (that is, step S1204) may include step S230 and step S240:

Step S230. Deposit the second conductive material on a side of the first conductive material away from the gate oxide layer, and the second conductive material covers the second interface layer.

Figure 14:
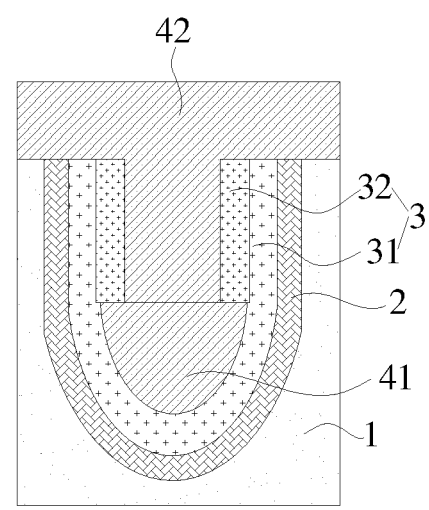
FIG. 14 is a schematic diagram of a structure obtained after step S230 is completed according to an implementation of the present disclosure.

As shown in FIG. 14, the second conductive material 42 may be deposited on the side of the first conductive material 41 away from the gate oxide layer 2 in a manner such as vacuum evaporation, magnetron sputtering, chemical vapor deposition, or atomic layer deposition. In order to ensure that the second conductive material 42 is in full contact with the second interface layer 32, during the filling process, the second conductive material 42 may be made to fill the gate trench 11 and overflow.

Step S240. Remove the second conductive material overflowing the gate trench by using the dry etching process, where the first conductive material and the second conductive material constitute the conductive layer.

Figure 15:
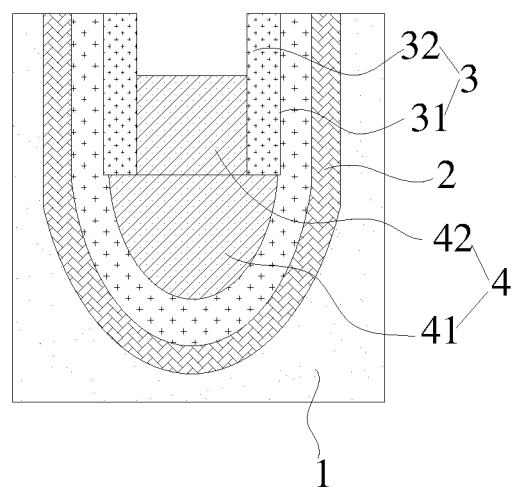
FIG. 15 is a schematic diagram of a structure obtained after step S240 is completed according to an implementation of the present disclosure.

As shown in FIG. 15, the second conductive material 42 overflowing the gate trench 11 may be removed by using a dry etching process, or the second conductive material 42 overflowing the gate trench 11 may be removed by using a chemical polishing process. This is not specially limited herein. During the removal of the second conductive material 42 overflowing the gate trench 11, the top surface of the second conductive material 42 may be made lower than an opening of the gate trench 11, to prevent the second conductive material 42 from being short-circuited due to communication with another component in the gate trench 11.

It should be noted that, the first conductive material 41 and the second conductive material 42 can constitute the conductive layer 4, and the first conductive material 41 and the second conductive material 42 can be integrally formed when process conditions permit.

As shown in FIG. 5, in step S130, the side of the interface layer away from the bottom of the gate trench is etched back by using the wet etching process, such that the top height of the interface layer is lower than the top height of the conductive layer.

The interface layer 3 wrapped around the periphery of the conductive layer 4 may be etched back by using the wet etching process, such that the top height of the interface layer 3 is lower than the top height of the conductive layer 4, and a distance of a gate-drain overlapping region is increased, thereby reducing a gate-induced drain leakage current. In this process, the interface layer 3 to be removed from a groove wall of the gate trench 11 can be completely removed by isotropic etching, to avoid residuals, thereby reducing a gate-induced drain leakage current; and avoid use of an additional cleaning process to clean residues, such that manufacturing costs can be reduced.

In an implementation, an etching back depth the interface layer 3 relative to the surface of the substrate 1 may be 5 nm to 50 nm. For example, the depth may be 5 nm, 10 nm, 20 nm, 30 nm, 40 nm, or 50 nm, an etching back depth the interface layer 3 relative to a top surface of the conductive layer 4 may be 1 nm to 30 nm. For example, the depth may be 1 nm, 5 nm, 10 nm, 15 nm, 20 nm, 25 nm, or 30 nm. Certainly, the etching back depth may have other values, which are not listed herein. During the etching back process, an OCD may be used to monitor the etching depth of the interface layer 3, to accurately control the etching back depth of the interface layer 3, such that etching back uniformity of the interface layer 3 in adjacent semiconductor structures can be improved. For example, during the etching process, the interface layer 3 may be preliminarily etched. After the preliminary etching is completed, the OCD may be used to measure the etching depth, and determine whether the etching depth meets a process requirement. When the etching depth does not meet an etching depth requirement, the interface layer 3 may be further etched, the etching depth thereof may be measured, and the etching stops until a detected depth meets the depth requirement.

In an implementation, the interface layer 3 may be etched by using a selective wet etching process. For example, the interface layer 3 may be selectively etched by using an etching solution to avoid damage to other film layers. Specifically, a corrosive solution may be used to selectively etch the interface layer 3. The corrosive solution may be a mixture of hydrogen peroxide and sulfuric acid. A mixture ratio thereof may range from 1:5 to 1:20, where the hydrogen peroxide accounts for 1 and the sulfuric acid accounts for 5 to 20.

For example, during the etching back process of the interface layer 3, an etching selectivity of the interface layer 3 and the conductive layer 4 may be 5 to 40, for example, may be 5, 10, 20, 30, or 40, or certainly, may be other values, which are not listed herein. For example, when the etching selectivity of the interface layer 3 and the conductive layer 4 may be 40, 1 nm of the conductive layer 4 is etched each time 40 nm of the interface layer 3 is etched.

An embodiment of the present disclosure further provides a semiconductor structure. The semiconductor structure may include a substrate 1, a gate oxide layer 2, an interface layer 3, and a conductive layer 4.

The substrate 1 may include a source region and a drain region spaced apart from each other, and a gate trench 11 located between the source region and the drain region.

The gate oxide layer 2 and the interface layer 3 are formed in sequence on the inner wall of the gate trench 11. The conductive layer 4 fills the gate trench 11. A side of the conductive layer 4 close to the bottom of the gate trench 11 has a larger width than a side of the conductive layer 4 away from the bottom of the gate trench 11. A thickness of a side of the interface layer 3 away from the bottom of the gate trench 11 is greater than a thickness of a side of the interface layer 3 close to the bottom of the gate trench 11, and the top height of the interface layer 3 is lower than the top height of the conductive layer 4.

The specific details, forming process, and beneficial effects of the part in the semiconductor structure have been described in detail in the corresponding method of forming the semiconductor structure. Therefore, details are not described herein again. For example, the semiconductor structure of the present disclosure may be a buried word line structure, and the word line structure may serve as a gate of a transistor and can control on or off of the transistor.

An embodiment of the present disclosure further provides a memory device. The memory device may include the semiconductor structure in any one of the foregoing implementations. The specific details and beneficial effects of the semiconductor structure have been described in detail in the corresponding embodiment of the semiconductor structure. Therefore, details are not described herein again.

The memory device may be a DRAM, or certainly, may be other storage apparatuses, which are not listed herein.

Those skilled in the art may easily figure out other implementations of the present disclosure after considering the specification and practicing the invention disclosed herein. The present disclosure is intended to cover any variations, purposes or adaptive changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

The invention claimed is:
1. A method of forming a semiconductor structure, comprising:
providing a substrate, wherein the substrate comprises a source region and a drain region spaced apart from each other, and a gate trench located between the source region and the drain region;

forming, in sequence on an inner wall of the gate trench, a gate oxide layer, an interface layer, and a conductive layer that fills the gate trench; a thickness of a side of the interface layer away from a bottom of the gate trench being greater than a thickness of a side of the interface layer close to the bottom of the gate trench; and etching back the side of the interface layer away from the bottom of the gate trench by using a wet etching process, such that a top height of the interface layer is lower than a top height of the conductive layer;

wherein the forming, in sequence on an inner wall of the gate trench, a gate oxide layer, an interface layer, and a conductive layer that fills the gate trench; a thickness of a side of the interface layer away from a bottom of the gate trench being greater than a thickness of a side of the interface layer close to the bottom of the gate trench comprises:

forming, in sequence on the inner wall of the gate trench, a fittedly attached gate oxide layer and a fittedly attached first interface layer, and a first conductive material that fills the gate trench;

etching the first conductive material by using a dry etching process, to expose a part of the first interface layer located on a side wall of the gate trench;

forming a second interface layer on a surface of the first interface layer located on the side wall of the gate trench, wherein the first interface layer and the second interface layer constitute the interface layer; and depositing a second conductive material on a surface of the first conductive material away from the gate oxide layer, and wrapping the second interface layer around a periphery of the second conductive material, wherein a side of the second interface layer close to the bottom of the gate trench may be in contact with a remaining surface of the first conductive material away from the gate oxide layer.

2. The method of forming a semiconductor structure according to claim 1, wherein the etching back the side of the interface layer away from the bottom of the gate trench by using a wet etching process, such that a top height of the interface layer is lower than a top height of the conductive layer comprises:

etching the interface layer by using a selective wet etching process, such that the top height of the interface layer is lower than the top height of the conductive layer.

3. The method of forming a semiconductor structure according to claim 2, wherein an etching selectivity of the interface layer to the conductive layer is 5 to 40.

4. The method of forming a semiconductor structure according to claim 1, wherein a depth of the gate trench is 100 nm to 300 nm, and a width of the gate trench is 10 nm to 50 nm.

5. The method of forming a semiconductor structure according to claim 4, wherein an etching depth of the first conductive material is 5 nm to 70 nm, and an etching back depth of the interface layer is 5 nm to 50 nm.

6. The method of forming a semiconductor structure according to claim 1, wherein the forming a second interface layer on a surface of the first interface layer located on the side wall of the gate trench comprises:

depositing an interface material on a surface of a structure constituted by the first conductive material, the first interface layer, and the gate oxide layer; and removing the interface material located on a region other than the side wall of the gate trench by using the dry etching process to form the second interface layer.

7. The method of forming a semiconductor structure according to claim 1, wherein the depositing a second conductive material on a surface of the first conductive material away from the gate oxide layer, and wrapping the second interface layer around a periphery of the second conductive material comprises:

depositing the second conductive material on a side of the first conductive material away from the gate oxide layer, wherein the second conductive material covers the second interface layer; and removing the second conductive material overflowing the gate trench by using the dry etching process, wherein the first conductive material and the second conductive material constitute the conductive layer.

8. The method of forming a semiconductor structure according to claim 1, wherein a material of the first conductive material is the same as a material of the second conductive material.

9. The method of forming a semiconductor structure according to claim 1, wherein a thickness of the first interface layer is 0.5 nm to 2 nm, and a thickness of the second interface layer is 2 nm to 10 nm.

* * * * *